United States Patent [19]
Hocker et al.

[11] Patent Number: 5,534,111
[45] Date of Patent: Jul. 9, 1996

[54] THERMAL ISOLATION MICROSTRUCTURE

[75] Inventors: G. Benjamin Hocker; James O. Holmen; Robert G. Johnson, all of Minnetonka, Minn.

[73] Assignee: Honeywell Inc., Minneapolis, Minn.

[21] Appl. No.: 172,118

[22] Filed: Feb. 29, 1988

[51] Int. Cl.[6] .............................. B44C 1/22; C23F 1/02
[52] U.S. Cl. ............................... 216/15; 156/345; 342/5; 257/16; 204/192.32; 216/48; 216/67; 216/79
[58] Field of Search ........................ 156/345, 643, 156/646, 655, 668; 204/192.32; 357/15, 16; 342/5; 257/16

[56]                  References Cited

U.S. PATENT DOCUMENTS

| 3,980,915 | 9/1976 | Chapman et al. | 357/15 X |
| 4,416,051 | 11/1983 | Thomas et al. | 437/12 X |
| 4,689,112 | 8/1987 | Bersin | 156/345 X |
| 4,699,689 | 10/1987 | Bersin | 156/345 X |

Primary Examiner—Peter A. Nelson
Attorney, Agent, or Firm—Omund R. Dahle; John G. Shudy, Jr.

[57]                    ABSTRACT

A thermal isolation microstructure fabricated by a process which allows the ultra thinning of support legs for the microdetector.

6 Claims, 5 Drawing Sheets

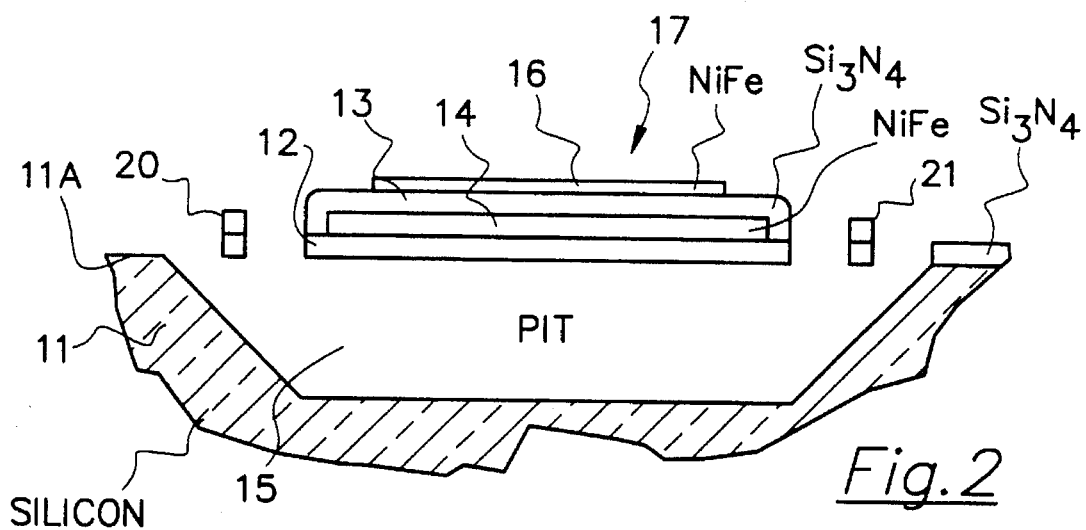
*Fig. 2*
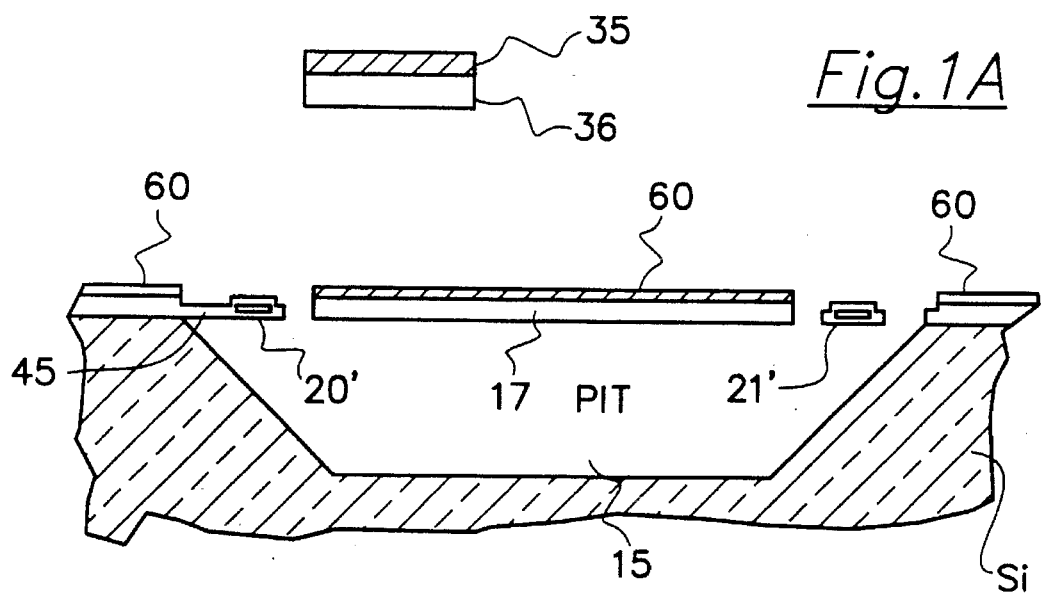
*Fig. 1A*
*Fig. 4A*
*Fig. 3A*
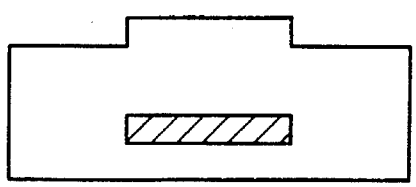

THERMAL ISOLATION MICROSTRUCTURE

BACKGROUND AND SUMMARY OF THE INVENTION

The U.S. Government has certain rights in this invention pursuant to the terms of a Contract DAAL01-85-C-0153.

This invention relates to the field of microstructure infrared radiation detector elements. Good thermal isolation of infrared radiation detector elements is required to maximize performance. The thermal isolation provided by the long detector support legs is presently limited because the relatively long legs must be thick enough to not break during turbulent liquid anisotropic etch of the pit in the silicon substrate beneath the detector, as well as thick enough to maintain the detector suspended out of contact with the substrate during and after the anisotropic etch. It is one object of this invention to provide an improved process which allows a minimizing of the cross section of the detector supporting legs. Another object is to provide a much narrower and thinner support leg of identifiably different cross section and a substantial performance improvement of the detector.

BRIEF DESCRIPTION OF THE DRAWINGS

FIG. 1a shows a cross section of the completed support leg for the microbridge element.

FIG. 2 shows an edge view of the structure of FIG. 1.

FIG. 3a shows a cross section of the support leg prior to the thinning steps.

FIGS. 4a and 4b are cross section views of FIG. 3.

DESCRIPTION

Figure 1:
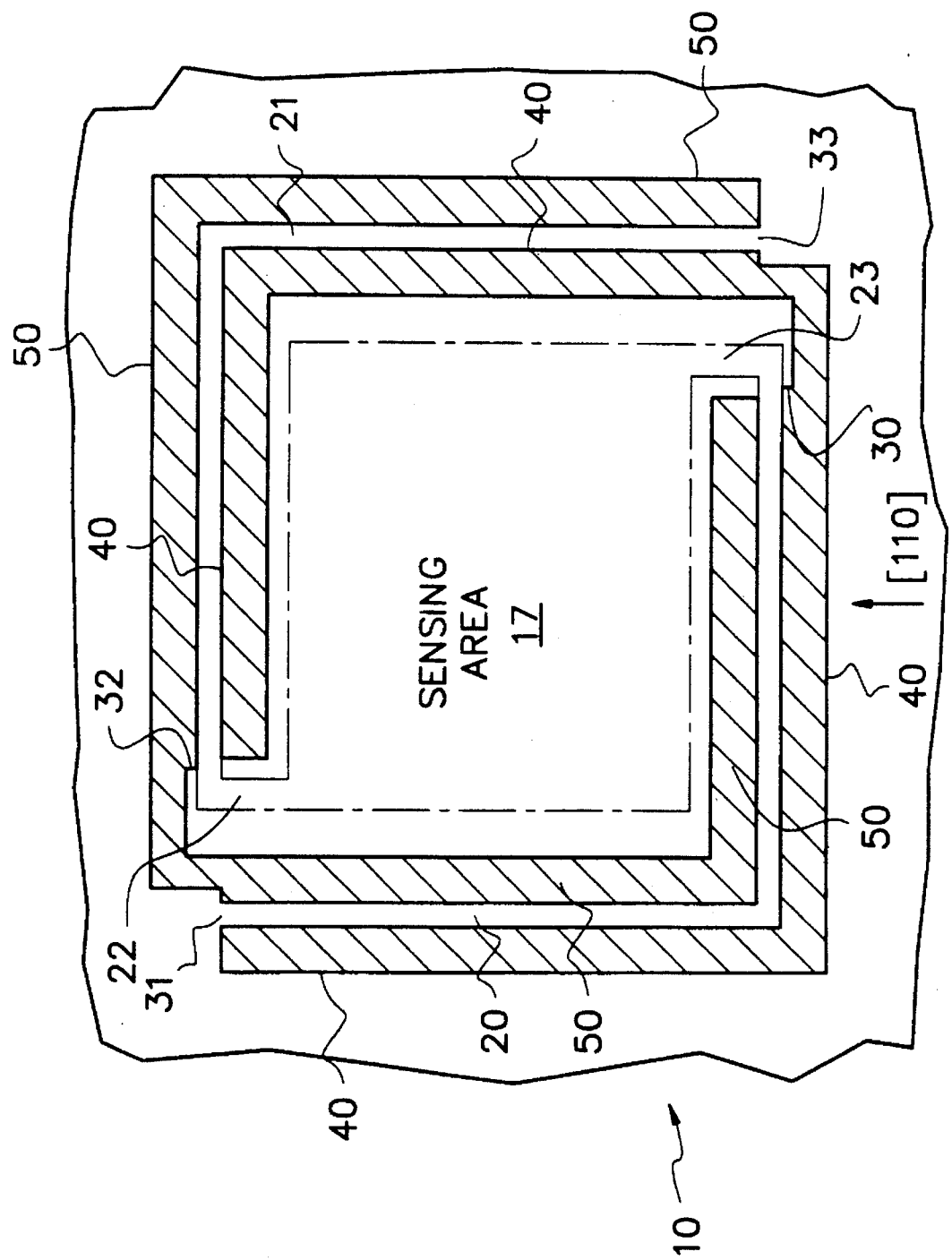
FIG. 1 shows a plan view of the microbridge infrared radiation detector element according to the invention.

Broadly stated, in the construction of a microbridge sensor device 10 a single crystalline (100) silicon substrate 11 has grown on the surface thereof a thin film layer of dielectric 12, 13 such as silicon nitride ($Si_3N_4$). Generally speaking, a thin film resistive radiation sensing element 14 is embedded in the silicon nitride; a thin film IR absorber layer 16 is over the dielectric; a pit 15 is etched out of the silicon beneath the sensing element, and the silicon nitride 12, 13 with sensing element 14 and absorber 16 is a thermally isolated bridge 17 over the etched pit in silicon substrate. The microbridge 17 is supported by two long thin support legs 20 and 21.

The objective of the invention is to decrease the thermal conductance of the detector support leg by fabricating a leg having a cross section shown in FIG. 1a which contrasts to the earlier designed cross section shown in FIG. 3a. The thermal conductance of the FIG. 1a leg is due to the conductance of the metal electrode combined with that of the nitride. The conductance can be one half or less that of the conductance of the leg shown in FIG. 3a, depending on the electrode metal that is used. A conventional metal is 80Ni:20Fe alloy. Other conductive metals could be used.

Figure 3:
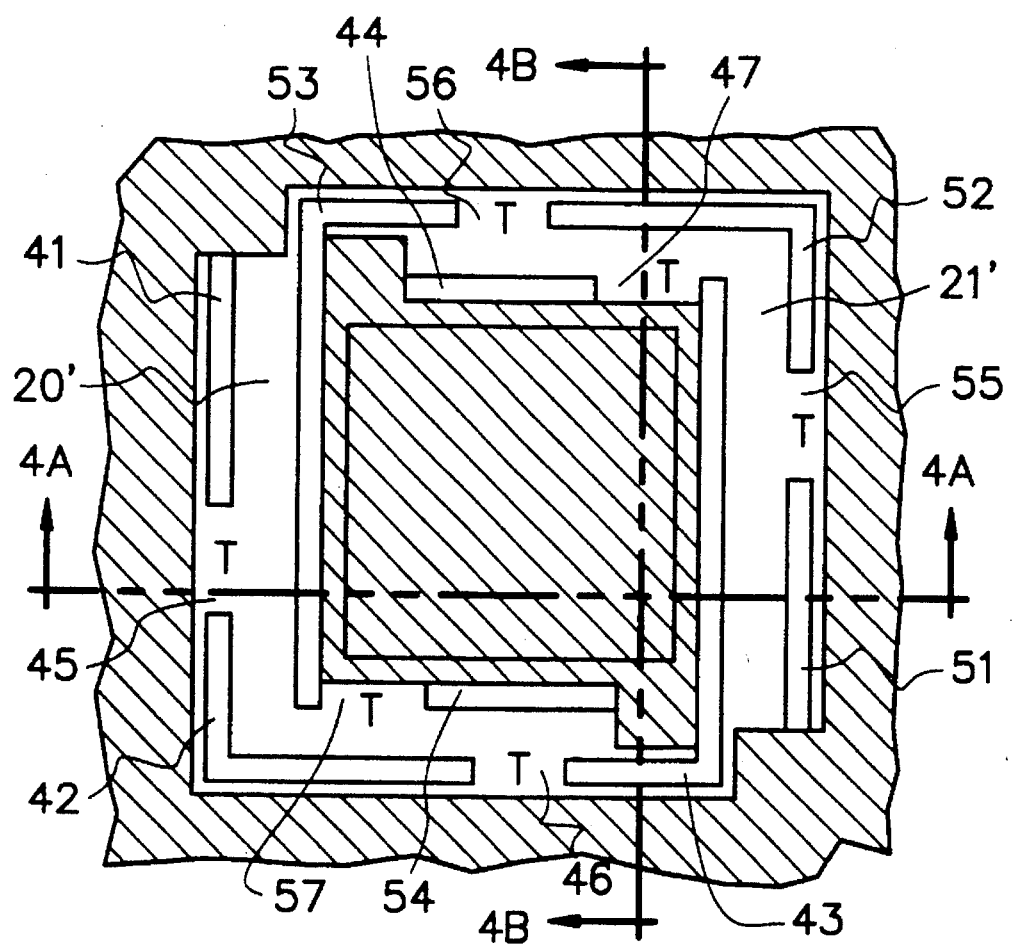
FIG. 3 shows the plan view at an intermediate point in the process before tab removal, and before the support legs are made narrower and thinner by the final dry etch. Metal lines are not shown.

The leg of FIG. 1a is too weak to withstand the turbulent etch process during which liquid forces on the detector could break such thin support legs. This difficulty can be avoided by designing the support legs with connecting tabs as shown in FIG. 3. The legs and their support tabs are then thinned to about ½ thickness before the liquid anisotropic etch. The main detector area is protected during this step by a chrome metal mask which extends a few microns beyond the absorber layer and the pit side well as shown in FIG. 3. During the anisotropic etch, the tabs also prevent the collapse of the detector into the etch pit. This potential collapse into the pit would occur because of surface tension effects. After the anisotropic etch, the chrome mask is removed by a final liquid etch. A final plasma "dry" etch then thins the legs and removes the support tabs by removing the last approximately 1500 angstroms of nitride, leaving the leg cross section of FIG. 1a.

During the last plasma dry etch, the absorber layer over the main detector acts as an etch stop. When completed, a length of metal electrode a few microns long in the leg will still be encased in nitride at each end of the leg as a precaution against electrical leakage and shorting to the absorber layer 16 or the silicon substrate. When the last plasma dry etch is finished, the tabs will have been eliminated, and the long narrow electrode/nitride bimorph will tend to bend upward to raise the main detector 17 safely above the substrate, that is, to give a positive elevation of the detector above the substrate to prevent thermal shorting.

Referring now to FIG. 1 there is shown the top plan view of a microbridge infrared radiation detector element 10. FIG. 2 is an edge view or sectional view of FIG. 1 and carries like identifying numerals. The sensing element is made up of a sensing area identified by dashed lines. The sensing area or radiation sensing means could be a thin film sinuous nickel-iron resistor element or an area of deposited thin film of some other temperature-sensitive electrically resistive material. In these figures can be seen a completed detector element structure. The substrate 11 is single crystalline (100) silicon having a planar surface 11a upon which has been sputter deposited a thin film layer 12, 13 of a dielectric such as silicon nitride. The thin film layer may be on the order of a micron in thickness and may have about half of the layer deposited first, then a thin film resistive layer 14, such as NiFe, is sputtered on and delineated, followed by the depositing of the remainder 13 of the nitride layer to embed the resistive layer. The thickness of the NiFe layer 14 is about 800 angstroms. The delineating of the resistive layer 14 is to provide a sinuous (see FIG. 5) or tortuous resistive path 14' through the sensing area 17 starting at an entrance point 22 and continuing to an exit point 23. The sinuous path shown in the sensing area 17 is exemplary for obtaining a desired resistance value and is not a part of the invention.

The radiation sensing means has a pair of elongated support legs including leadout means which provide the electrical connections to and from the radiation sensing means. The leadout means are fabricated on a pair of silicon nitride leadout areas between two etch window cuts in the silicon nitride and semienclose the sensing means. The window cuts in the silicon nitride are areas defined for providing access to introduce anisotropic etchant for anisotropically etching a pit beneath the sensing area. The L-shaped support leg 20 is connected to the bridge member 17 at tab 30 and to the substrate at the opposite end 31. Likewise, the L-shaped support leg 21 is connected in supporting relation to the bridge member 17 at tab 32 and to the substrate at the opposite end 33. An enlarged cross sectional view of the completed L-shaped support legs 20 and 21 is shown in FIG. 1a and comprises the NiFe conductor 35 (i.e. layer 14) on the nitride strip 36 (i.e. layer 12). Exemplary dimensions of the support legs are shown in FIG. 1a with a width of 1.5 micron, a nitride thickness of 0.10 micron and a 0.04 micron metal thickness. Since the leg 20 (or 21) extends around two adjacent sides of the perimeter of the microbridge, the length of the L-shaped support leg is on the order of 600 microns. In the plan view of FIG. 1, the L-shaped legs 20 and 21 are bordered by a pair of interlocking cuts 40 and 50 through the silicon nitride layer 12, 13. At an earlier step in the fabrication, to be explained below, these silicon nitride cuts are six sections in number and sections are separated by leg supporting tabs.

Referring now to FIG. 3 (which is in many ways similar to FIG. 1) there is shown the top plan view at an intermediate point in the process of fabricating the sensor structure and before all the steps are completed that result in the final device.

In FIG. 3 one set of the silicon nitride cuts 41, 42, 43 and 44 is shown which in the final device is numbered 40. Another set of silicon nitride cuts 51, 52, 53 and 54 is shown which in the final device is numbered 50. Between adjacent ends of cuts 41 and 42 is a tab 45; adjacent ends of cuts 42 and 43 is a tab 46, and between adjacent ends of cuts 43 and 44 is a tab 47. Between adjacent ends of cuts 51 and 52 is a tab 55; between adjacent ends of cuts 52 and 53 is a tab 56; and between adjacent ends of cuts 53 and 54 is a tab 57. The six tabs are positioned along the length of the legs to stabilize and protect the legs and main detector area until the turbulent liquid etch process is completed. Without the protection of the tabs there would be the possibility of a collapse of the detector into the etch pit which could occur because of surface tension effects. The six tabs are to be removed in final stages of fabrication.

Figure 4B:
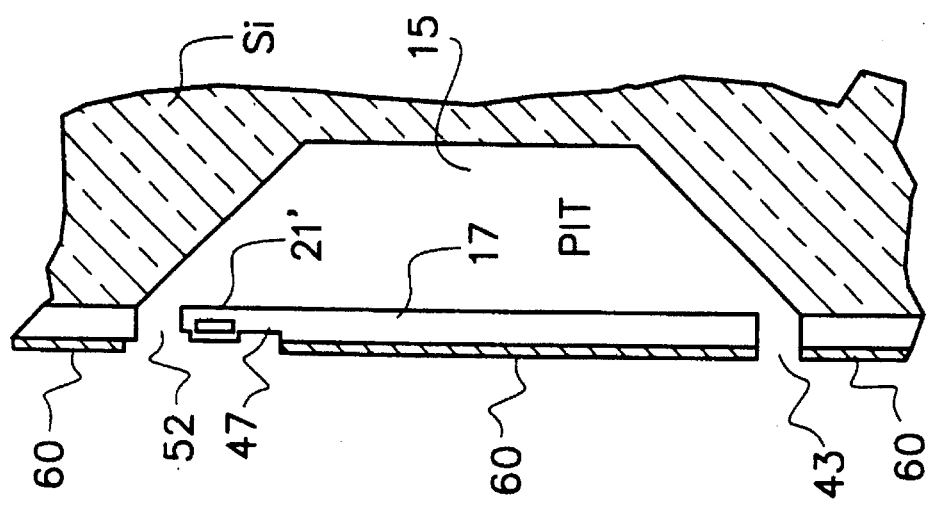
Figure 6A:
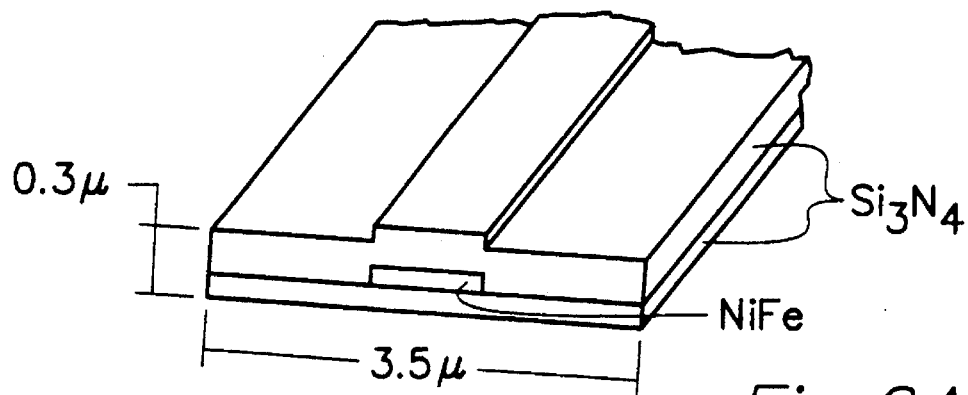
FIGS. 6a, b and c shows successive steps in the process of fabricating the support legs.
Figure 6B:
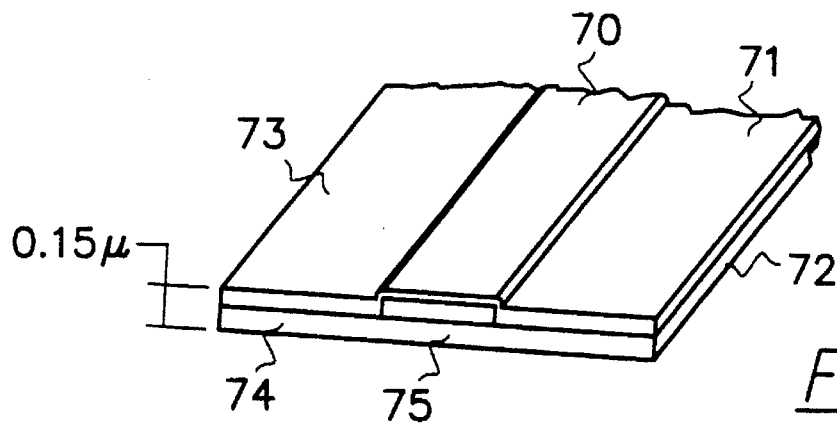

FIG. 4a—a' is a cross section view taken at line AA of FIG. 3. In this figure the layer structure is predominantly the same as explained in FIG. 2. In this intermediate stage an additional thin film chromium photolithographic metal mask 60 is shown which has been deposited and delineated over the structure to protect it while a dry etch step thins the uncoated $Si_3N_4$ of the legs 20' and 21' and their six support tabs. FIG. 6a shows a short section of the leg 20' (or 21') prior to the dry etch. At that point the legs are about 3.5μ wide and about 0.3μ in thickness. Following the dry etch step which removes about half of the silicon nitride the structure appears as shown in FIG. 6b. The six thinned support tabs are still intact, FIG. 3, to support the legs and sensor structure during the anisotropic etch. In FIG. 4a is shown the thinned legs 20' and 21' as well as tab 45 as also shown is the etched pit following the anisotropic etch. In FIG. 3 the hatched area is added to represent the plan view location of the temporary chrome mask 60. In FIG. 4b—b' is shown a section from the other direction. In FIG. 4b—b' there is shown the thinned leg 21' and the thinned tab 47. Slots 43 and 52 are shown.

Figure 6C:
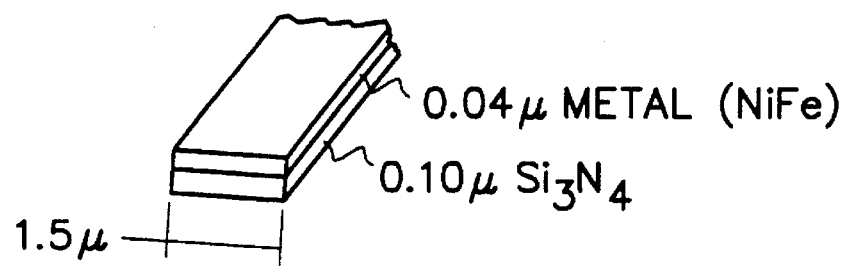

After the pit has been etched anisotropically the turbulent etch procedures are completed. The protective chrome 60 has now served its purpose and is removed with a final liquid etch. Referring now to the legs shown in FIG. 6c as compared with FIG. 6b, a final plasma etch removes the remaining silicon nitride 70 over the metal conductor and also the silicon nitride areas 71, 72, 73 and 74 and the six tabs. The silicon nitride 75 under the metal conductor is protected by the metal and remains as shown in FIG. 6c. As the $Si_3N_4$ is etched away to release the tabs there is a bimorph affect of the remaining portion of the legs to tend to raise the main detector 17 and keep it above the substrate preserving the thermal isolation under the detector.

Figure 5:
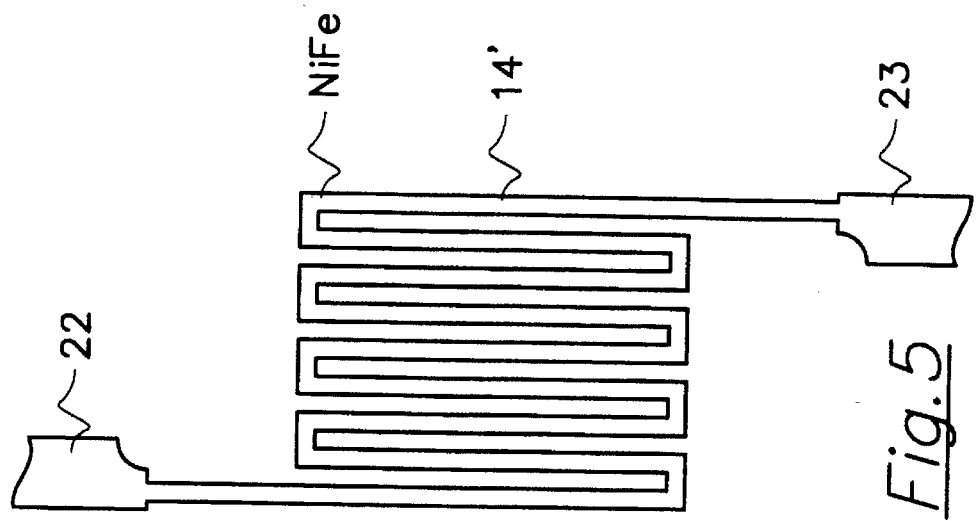
FIG. 5 shows en exemplary sensing element embedded in the microbridge.

Referring again to FIG. 1 there is shown a sensing area 17. The NiFe sensor is shown at layer 14 of FIG. 2. FIG. 5 shows in more detail how the embedded sensor 14 layout and electrode leadout would preferably be designed.

SUMMARY OF MAIN PROCESS STEPS

1. Provide monocrystalline silicon wafer substrate.
2. Deposit $Si_3N_4$ layer.
3. Deposit and delineate NiFe sensor and leads.
4. Deposit $Si_3N_4$ layer to embed NiFe in the $Si_3N_4$.
5. Deposit absorber layer of NiFe.
6. Cover absorber layer with 300–400 A $Si_3N_4$.
7. Cover surface with chrome metal mask and delineate chrome.
8. Make six $Si_3N_4$ etch cuts.
9. Thin legs and support tabs to ½ thickness by dry etch.
10. Anisotropically etch the pit in Si.
11. Remove chrome with final liquid etch.
12. Perform final plasma dry etch to thin and narrow legs and remove support tabs by removing $Si_3N_4$.

The embodiments of the invention in which an exclusive property or right is claimed are defined as follows:

1. A process for fabricating a thermal isolation microbridge used as an infrared radiation detection element, the steps comprising:

providing a monocrystalline silicon substrate wafer having a planar surface;

depositing a thin film silicon nitride layer on said surface;

depositing and delineating a thin film layer of temperature-sensitive, electrically-resistive material for a sensor and electrode leadout on said silicon nitride layer;

depositing a further thin film silicon nitride layer over said material and said first silicon nitride layer;

depositing a thin absorber layer over the last deposited silicon nitride in the area of the sensor;

depositing and delineating a thin film photo-lithographic mask;

making a plurality of silicon nitride cuts outlining the elongated legs containing the electrode leadout and the support tabs for the microbridge;

dry etching the legs and the support tabs to remove about ½ the thickness of silicon nitride;

introducing anisotropic etchant through said cuts and anisotropically etching away silicon to form a pit beneath the microbridge sensor and legs;

removing the thin film photolithographic mask with a liquid etch;

etching with a plasma dry etch the exposed silicon nitride on said elongated legs to remove the $Si_3N_4$ down to the electrode leadouts, which act as an etch stop to the dry etch, the plasma dry etch also removing the $Si_3N_4$ of the leg extending laterally of the electrode.

2. The process according to claim 1 and directly following said step "depositing a thin absorber layer over the lest deposited silicon nitride in the area of the sensor", further comprising the step:

covering said absorber layer with a thin film layer of silicon nitride.

3. The process according to claim 1 in which said temperature sensitive electrically-resistive material is nickel-iron.

4. The process according to claim 1 in which said absorber layer is a thin film layer of nickel-iron.

5. The process according to claim 1 in which said photolithographic mask is chrome metal.

6. A process for fabricating a thermal isolation microbridge used as an infrared radiation detection element, the steps comprising:

providing a monocrystalline silicon substrate wafer having a planar surface depositing a thin film silicon nitride layer on said surface;

depositing and delineating a thin film layer of nickel-iron for a sensor and leadout on said silicon nitride layer;

depositing a further thin film silicon nitride layer over said material and said first silicon nitride layer;

depositing a thin film absorber layer of nickel-iron over the last deposited silicon nitride in the area of the nickel-iron sensor;

covering said absorber layer with a thin film layer of silicon nitride;

depositing and delineating a thin film chrome metal mask;

making a plurality of silicon nitride cuts outlining the elongated legs containing the nickel-iron leadout and the support tabs for the microbridge;

dry etching the legs and the support tabs to remove about ½ the thickness of silicon nitride;

introducing anisotropic etchant through said cuts and anisotropically etching away silicon to form a pit beneath the microbridge sensor and legs;

removing the thin film chrome layer with a liquid etch;

etching with a plasma dry etch the exposed silicon nitride on said elongated legs to remove the $Si_3N_4$ down to the NiFe leadout, which NiFe acts as an etch stop to the dry etch, the plasma dry etch also removing the $Si_3N_4$ of the leg extending laterally of the NiFe.

* * * * *